United States Patent
Chang et al.

(10) Patent No.: US 9,684,029 B2
(45) Date of Patent: Jun. 20, 2017

(54) TRANSMISSION LINE PULSE AND VERY FAST TRANSMISSION LINE PULSE REFLECTION CONTROL

(71) Applicants: International Business Machines Corporation, Armonk, NY (US); Grund Technical Solutions, Milpitas, CA (US)

(72) Inventors: Shunhua T. Chang, South Burlington, VT (US); Robert J. Gauthier, Jr., Hinesburg, VT (US); Evan Grund, San Jose, CA (US)

(73) Assignees: International Business Machines Corporation, Armonk, NY (US); Grund Technical Solutions, Milpitas, CA (US)

( * ) Notice: Subject to any disclaimer, the term of this patent is extended or adjusted under 35 U.S.C. 154(b) by 439 days.

(21) Appl. No.: 14/507,363

(22) Filed: Oct. 6, 2014

(65) Prior Publication Data
US 2016/0097804 A1   Apr. 7, 2016

(51) Int. Cl.
*G01R 31/28* (2006.01)
*G01R 31/00* (2006.01)

(52) U.S. Cl.
CPC ....... *G01R 31/2839* (2013.01); *G01R 31/002* (2013.01); *G01R 31/2851* (2013.01)

(58) Field of Classification Search
USPC ...... 324/750.01, 601, 113, 605, 676, 750.02, 324/642, 762.01, 762.02, 533, 537, 678, 324/457, 534, 612; 372/25, 30; 438/5, 438/72; 455/226.1, 67.11, 67.13
See application file for complete search history.

(56) References Cited

U.S. PATENT DOCUMENTS

| | | |
|---|---|---|
| 5,583,449 A | 12/1996 | Buuck et al. |
| 5,757,654 A | 5/1998 | Appel |
| 2007/0159186 A1* | 7/2007 | Grund ............. G01R 27/04 324/678 |
| 2008/0315891 A1 | 12/2008 | Grund |
| 2009/0219038 A1 | 9/2009 | Stockinger |

(Continued)

FOREIGN PATENT DOCUMENTS

GB    656023    8/1951

OTHER PUBLICATIONS

"Long Line Receiver and Timing Circuits for Josephson Logic" IBM TDB 06-79 p. 406-408 IPCOM000067199D; Feb. 20, 2005.

(Continued)

*Primary Examiner* — Melissa Koval
*Assistant Examiner* — Nasima Monsur
(74) *Attorney, Agent, or Firm* — Steven J. Meyers; Hoffman Warnick LLC

(57) ABSTRACT

An approach for transmission line pulse and very fast transmission line pulse reflection control is provided. The approach includes using a power splitter to split an incident pulse into two identical pulses with one going to a device under test (DUT) through a delivery cable and the other going down an open ended delay cable. The structure of the power splitter, along with having the delivery cable and the open ended delay cable with the same signal propagation time and pulse transmission characteristics enable the canceling of pulse reflections from the DUT.

20 Claims, 6 Drawing Sheets

(56) References Cited

U.S. PATENT DOCUMENTS

2010/0225412 A1  9/2010  Rijssemus
2011/0187399 A1  8/2011  Laquai
2014/0084950 A1* 3/2014  Chang .................. G01R 31/002
                                              324/750.01

OTHER PUBLICATIONS

"Shunt stub line impedance matching: a wave reflection analysis tutorial" Best, S.R. Antennas and Propagation Magazine, IEEE vol. 44, Issue: 1, Publication Year: 2002, pp. 76-86 Digital Object Identifier: 10.1109/74.997910.

* cited by examiner

TRANSMISSION LINE PULSE AND VERY FAST TRANSMISSION LINE PULSE REFLECTION CONTROL

BACKGROUND

The present invention relates generally to testing integrated circuit devices, and more particularly, to providing reflection control during transmission line pulse (TLP) and very-fast transmission line pulse (VF-TLP) testing of electrostatic discharge (ESD) protection devices on a wafer.

TLP and VF-TLP testing of an ESD protection device, which may be included as part of an integrated circuit device under test (DUT), is typically performed by using a high-voltage power supply to charge a transmission line at a predetermined voltage level. A switch or relay is then closed to connect the charged transmission line to the DUT via a pulse delivery cable. The transmission line discharges into the DUT by delivering pulses (e.g., TLP, VF-TFLP) through the pulse delivery cable to the DUT. A reflection of the pulses from the DUT usually occurs because of an impedance mismatch that exists between the ESD protection device or the DUT and the pulse generator (i.e., the high-voltage power supply, transmission line, switch and pulse delivery cable) that delivers the pulses. The reflection typically causes a large percentage of the incident pulse energy to travel back to the pulse generator. Since the DUT typically has a lower impedance than the pulse generator, the voltage pulse reflection polarity from the DUT is typically inverted from the incident pulse. The pulse generator, which can be a TLP or VF-TLP pulse generator, will cause a re-reflection of the reflected pulse energy from the pulse generator back to the DUT with the same polarity as the reflection from the DUT. This re-reflection will stress the DUT with re-reflected pulse energy that is typically in an inverted polarity from the polarity of the DUT that enables it to protect against voltage transients. Stressing the DUT with a reverse or inverted polarity will eventually cause it to fail and result in erroneous current and voltage measurement characterizations of the ESD protection device.

SUMMARY

In one embodiment of the present invention there is a pulse delivery circuit. In this embodiment, the pulse delivery circuit comprises a device under test (DUT). A pulse generator is configured to generate an incident pulse for application to the DUT. A power splitter having an input and a first output and a second output, splits the incident pulse into two substantially identical pulses each having a polarity that is the same as the incident pulse. A delivery cable having an approximately constant impedance along its length is connected to the first output of the power splitter. The delivery cable receives a first split pulse from the first output and transmits the first split pulse to the DUT. An open-ended delay cable has an approximately constant impedance along its length and similar end-to-end pulse propagation delay time as the delivery cable. The open-ended delay cable is connected to the second output of the power splitter to receive a second split pulse from the second output. The power splitter receives a first pulse reflection from the DUT via the delivery cable at the first output. The first pulse reflection has a polarity that is inverted or non-inverted in comparison to the first split pulse, and a magnitude that ranges from zero to full magnitude of the first split pulse. The power splitter receives a second pulse reflection from the open-ended delay cable at the second output, with a polarity that is the same as the polarity of the second split pulse and a magnitude that is similar to the magnitude of the second split pulse. The first pulse reflection and the second pulse reflection are received at the power splitter at approximately the same time due to the delivery cable and the open-ended delay cable having similar end-to-end pulse propagation delay times. The power splitter combines the first pulse reflection and the second pulse reflection in equal parts. The power splitter attenuates and re-reflects the combined equal parts of the first pulse reflection and the second pulse reflection as re-reflected pulses that have a polarity that is the same as the polarity of the incident pulse. The power splitter directs a first portion of re-reflected pulses to the pulse generator from the input, a second portion of re-reflected pulses to the DUT from the first output via the delivery cable, and a third portion of re-reflected pulses to the open-ended delay cable from the second output. All of the re-reflected pulses to the DUT and the open-ended delay cable are attenuated approximately equally.

In another embodiment of the present invention there is method. The method comprises: generating an incident pulse with a pulse generator; applying the incident pulse to a power splitter having an input and a first output and a second output each having a resistor element that connects to the input; splitting the incident pulse into two substantially identical pulses each having a polarity that is the same as the incident pulse with the power splitter; directing a first split pulse from the first output of the power splitter to a delivery cable having an approximately constant impedance along its length that transmits the first split pulse to a device under test (DUT); directing a second split pulse from the second output of the power splitter to an open-ended delay cable having an approximately constant impedance along its length that provides an end-to-end pulse propagation delay time that is substantially identical to that of the delivery cable; receiving a first pulse reflection from the DUT via the delivery cable at the first output of the power splitter, the first pulse reflection having a polarity that is inverted or non-inverted in comparison to the first split pulse, and a magnitude that ranges from zero to full magnitude of the first split pulse; receiving a second pulse reflection from the open-ended delay cable at the second output of the power splitter, the second pulse reflection having a polarity that is the same as the second split pulse and a magnitude that is similar to a magnitude of the second split pulse, wherein the first pulse reflection and the second pulse reflection are received at the power splitter at approximately the same time due to the delivery cable and the open-ended delay cable having similar end-to-end pulse propagation delay times; combining the first pulse reflection and the second pulse reflection in equal parts at the power splitter; and attenuating and re-reflecting the combined equal parts of the first pulse reflection and the second pulse reflection as re-reflected pulses from the power splitter that have a polarity that is the same as the polarity of the incident pulse, wherein the power splitter directs a first portion of re-reflected pulses to the pulse generator from the input, a second portion of re-reflected pulses to the DUT from the first output via the delivery cable, and a third portion of re-reflected pulses to the open-ended delay cable from the second output, wherein all of the re-reflected pulses to the DUT and the open-ended delay cable are attenuated approximately equally.

DETAILED DESCRIPTION

The various embodiments of the present invention are directed to using a reflection produced when pulses encounter an impedance mismatch that exists at an end of an open-ended transmission line cable. In particular, an incident transmission line pulse (TLP) or a very-fast transmission line pulse (VF-TLP) is split into two similar pulses. The first pulse is delivered to a device under test (DUT) and the second pulse is used to generate a reflection that will cancel out any inverted voltage reflection from the DUT that otherwise can produce a large re-reflection of reflected pulse energy to the DUT, leading to its failure. Canceling out the inverted voltage reflection ensures that the DUT never receives an inverted polarity re-reflection that will stress the DUT and lead to failure. The various embodiments of the present invention can cancel out the inverted voltage reflections by using passive elements such as, for example, a power splitter, transmission lines, attenuators and filters, and not active or non-linear elements such as diodes and transistors.

Figure 1:
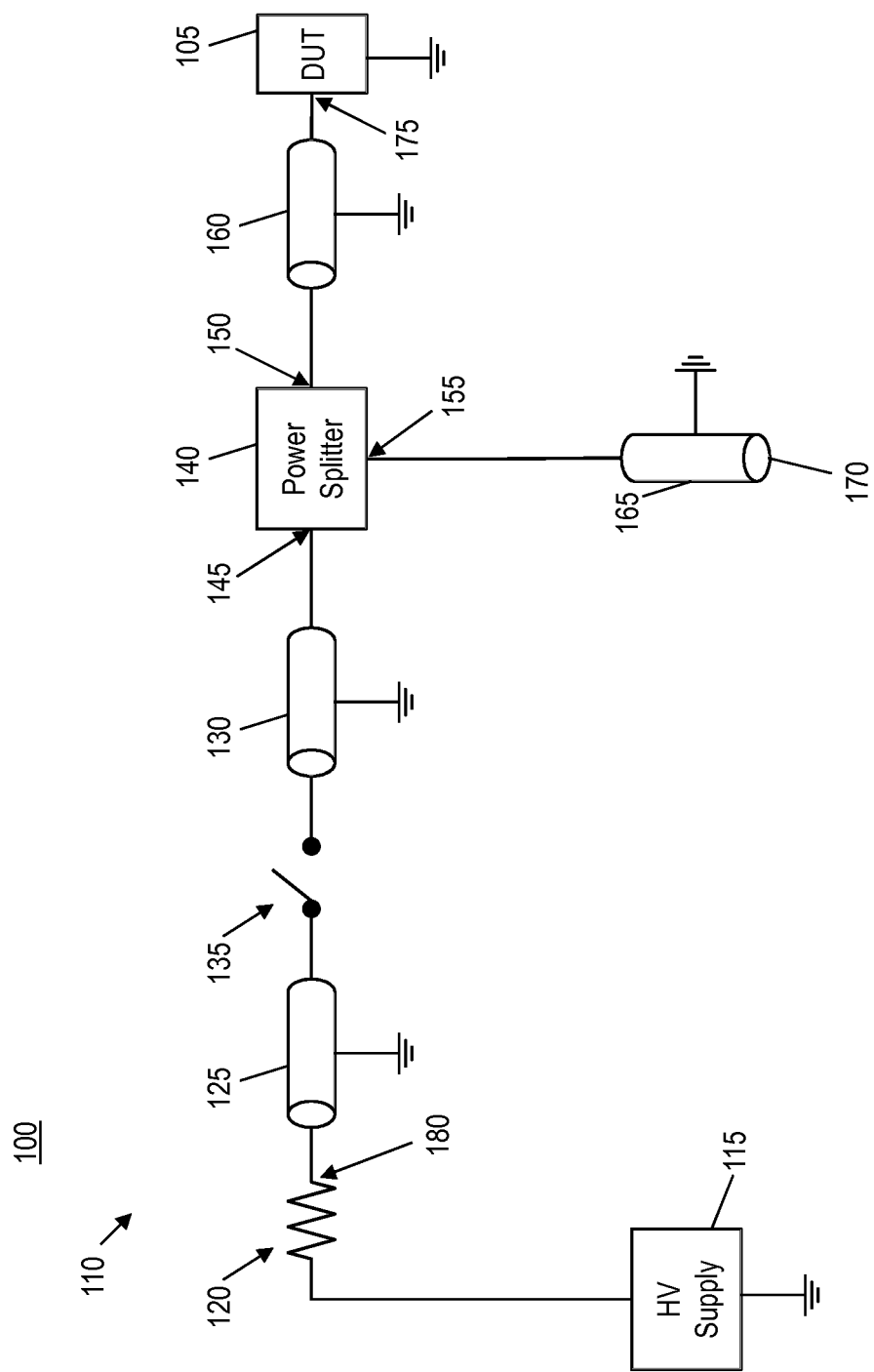
FIG. 1 shows a pulse delivery circuit according to an embodiment of the present invention.

Referring now to the figures, FIG. 1 shows a pulse delivery circuit 100 according to an embodiment of the present invention that can test a DUT 105, which may be a circuit element, an electrostatic discharge (ESD) protection device, or an integrated circuit having an ESD protection device. The pulse delivery circuit 100 comprises a pulse generator 110 configured to generate an incident pulse for application to the DUT 105. As shown in FIG. 1, the pulse generator 110 can comprise a high voltage power supply 115 (HV Supply), a charge current limiting resistor 120, a charge line 125 (e.g., a transmission line), a charge delay line 130 (e.g., a transmission line), and a switch 135 separating the charge line 125 from the charge delay line 130.

The pulse delivery circuit 100 further comprises a power splitter 140 that receives the incident pulse generated from the pulse generator 110. As shown in FIG. 1, the power splitter 140 can have an input 145, a first output 150 and a second output 155. In this manner, the power splitter 140 can split the incident pulse into two substantially identical pulses. As used herein, "substantially identical pulses" are pulses that have a difference in width or duration of 10% or less and a difference in amplitude of 10% or less. As is well known in the art, TLP and VF-TLP pulses can range in width or duration from sub-nanoseconds (ns) to microseconds (µs) and have amplitudes that range from millivolts (mV) to kilovolts (kV).

FIG. 1 shows that the pulse delivery circuit 100 further comprises a delivery cable 160 and an open-ended delay cable 165 both having lengths that are substantially similar along with end-to-end signal propagation time and pulse transmission characteristics that are substantially similar. As used herein, cables having "pulse transmission characteristics that are substantially similar" are cables of lengths from a fraction of an inch to hundreds of feet that have a difference of attenuation of signals propagating through them of 10% or less. As used herein, cables with "substantially similar end-to-end signal propagation time" are signal propagation times that differ by 10 percent or less of each other.

The delivery cable 160 has an approximately constant impedance along its length and is connected to the first output 150 of the power splitter 140. In this manner, the delivery cable 160 receives a first split pulse from the first output 150 of the power splitter 140 and transmits the first split pulse to the DUT 105. As used herein, the "first split pulse" can include any pulse reflection and re-reflections emanating from the input 145 and the first output 150 and the second output 155 that the power splitter 140 directs to the delivery cable 160 via the first output 150. The open-ended delay cable 165, having an open circuit termination 170, an approximately constant impedance along its length, and similar end-to-end pulse propagation time as the delivery cable 160 is connected to the second output 155 of the power splitter 140 to receive a second split pulse. As used herein, the "second split pulse" can include any pulse reflection and re-reflections emanating from the input 145 and the first output 150 and the second output 155 that the power splitter 140 directs to the open-ended delay cable 165 via the second output 155. In this manner, the open circuit termination 170 produces a reflection of any split pulse received from the second output 155 of the power splitter 140. As used herein, cables with "approximately constant impedance along their length" will have impedances that vary by 20% or less at points along their length.

In the pulse delivery circuit 100, there is a mismatch in impedance between the DUT 105 and the pulse generator 110, the power splitter 140, the delivery cable 160 and the open-ended delay cable 165. In particular, the elements of the pulse generator 110, the power splitter 140, the delivery cable 160 and the open-ended delay cable 165 are arranged and structured to have substantially matching impedance. The DUT 105, on the other hand, typically has a much lower impedance. For example, in one embodiment, the elements of the pulse generator 110, the power splitter 140, the delivery cable 160 and the open-ended delay cable 165 can have an impedance of about 50 ohms (Ω) while the DUT 105 can have an impedance of about 0.5Ω. By the nature of this mismatch in impedance between the DUT 105 and the pulse generator 110, the power splitter 140, the delivery cable 160 and the open-ended delay cable 165, an inverted reflection is formed between the delivery cable 160 and the DUT 105, while the open circuit termination forms a non-inverted reflection at 170. As used herein, an "inverted reflection" occurs at an impedance discontinuity when the pulse traveling into the discontinuity and the reflection traveling back from the discontinuity have different voltage polarities, while a "non-inverted reflection" occurs at an impedance discontinuity when the pulse traveling into the discontinuity and the reflection traveling back from the discontinuity have the same voltage polarities. Additionally, any pulse can be compared with the incident pulse from the pulse generator or the first split pulse from the power splitter, and can be described as inverted when their polarities are different and non-inverted when their polarities are the same.

In operation, the high voltage power supply 115 can charge the charge line 125 through the charge current limiting resistor 120 while the switch 135 is open. The switch 135 can then be closed, to electrically connect the charged charge line 125 to the DUT 105 such that a high current pulse, i.e., the incident pulse, is directed toward the DUT 105. The high voltage power supply 115, the charge current limiting resistor 120, the charge line 125, and the charge delay line 130 of the pulse generator 110 may be collectively configured to provide any desired pulse to the DUT 105 such as a TLP and a VF-TLP. For example, TLP includes high-current pulses (e.g., about 20 amperes (A)) with about a 1 to 10 nanosecond (ns) rise time and a pulse width that ranges from about 30 ns to about 100 ns, while VF-TLP includes high-current pulses (e.g., up to and greater than 20 A) with about a 100 picoseconds (ps) rise time and about a 1 ns pulse width. In another embodiment, the pulse generator 110 can be a solid-state pulse generator (e.g., a solid-state pulser) that generates pulses with up to about 500 V amplitude with about 10 ns or longer pulse width and about 1 ns or longer rise time. In this embodiment, the high voltage power supply 115, the charge current limiting resistor 120, the charge line 125 and the switch 135 can be replaced by the solid-state pulse generator.

The power splitter 140 receives the incident pulse generated from pulse generator 110 at input 145. The power splitter 140 splits the incident pulse into a first split pulse that is directed to delivery cable 160 via the first output 150 and a second split pulse that is directed to the open-ended delay cable 165 via the second output 155. The first split pulse and the second split pulse are substantially identical pulses that have the same polarity as the incident pulse. The first split pulse will stress the DUT 105 and cause a reflection such that a first reflected pulse is directed from the DUT to the first output 150 of the power splitter 140 via the delivery cable 160. The second split pulse is used by the open-ended delay cable 165 to generate a delayed non-inverted pulse (i.e., same polarity of the incident pulse) that is directed to the second output 155 of the power splitter 140. The power splitter 140 combines the reflections from the DUT 105 and the open-ended delay cable 165, and splits the reflected pulses into re-reflections such that re-reflected pulses are directed to the DUT and the open-ended delay cable 165. In particular, the power splitter 140 combines the reflected pulses such that the resulting combined reflections (i.e., the re-reflected pulses) are non-inverted relative to the incident pulse going back to the DUT, and the non-inverted, second reflection pulse largely cancels out the first reflected pulse from the DUT 105 if the DUT impedance is significantly lower than the characteristic impedance of the pulse delivery system (i.e., the pulse generator 110, the power splitter 140, and the transmission line cables 125, 130, 160, and 165). Essentially, all of the re-reflected pulses to the DUT and the open-ended delay cable are attenuated approximately equally. As used herein, pulses that are "attenuated approximately equally" means pulses that have their amplitude reduced by factors which differ by 10% or less.

The aforementioned voltage reflections that occur in the pulse delivery circuit 100 can be characterized with reference to the well-known reflection coefficient Γ. In this manner, the DUT 105 will produce a voltage pulse reflection that will vary ($-1 \leq \Gamma \leq +1$) from being almost identical to the incident pulse (open circuit response, $\Gamma=+1$, due to an open circuit termination at the DUT) to a voltage pulse that is the same magnitude but inverted in polarity (short circuit response, $\Gamma=-1$, due to a short circuit termination at 175). Since the open-ended delay cable 165 is open circuited with the open circuit termination 170, it always produces a non-inverted full amplitude reflected pulse ($\Gamma=+1$). The reflections from both the DUT 105 and the open-ended delay cable 165 will reach both of the outputs 150 and 155 of the power splitter 140 at approximately the same time where they are combined. As used herein, reflections that are received at approximately the same time means that there is a difference in time of arrival of the two pulses that is within 10% of the pulse duration. The combined re-reflections generated from the power splitter 140 which emanate at outputs 150 and 155 are always non-inverted and vary in amplitude from a maximum of 50% of the first split pulse (for an open circuit DUT) to no net re-reflection (for a short circuit DUT). In this manner, the power splitter 140 attenuates the sources of secondary re-reflections that include echoes occurring from pulses traveling in the open-ended delay line 165 and also from pulses traveling in the open-ended charge line 125. All of these secondary re-reflections are attenuated by the power splitter 140 such that they are combined in equal parts and reflected back to the DUT 105 and the open-ended delay cable 165 equally. The sum of the re-reflections to the DUT 105 and the open-ended delay cable 165 is between zero and the original, first split pulse. The result is never inverted re-reflections. As the impedance of the DUT 105 approaches zero all the re-reflections will also approach zero.

Figure 2:
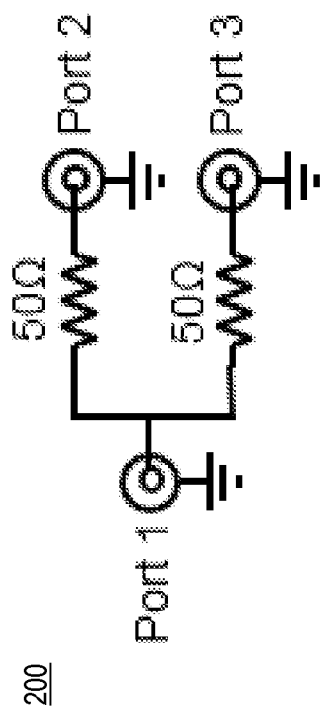
FIG. 2 shows a circuit schematic of a power splitter that can be implemented in the pulse delivery circuit depicted in FIG. 1 according to an embodiment of the present invention.

FIG. 2 shows a circuit schematic of a power splitter 200 that can be implemented in the pulse delivery circuit 100 of FIG. 1 according to an embodiment of the present invention. As shown in FIG. 2, power splitter 200 is a three-port power splitter that comprises Port 1, Port 2 and Port 3. Port 1 is equivalent to the input 145 of the power splitter 140 depicted in FIG. 1, while Port 2 and Port 3 equate to the output 150 and output 155, respectively. Port 2 and Port 3 each has a resistor element that connects to Port 1. As shown in FIG. 2, each resistor element has a 50Ω resistance, the impedance of the pulse delivery system in this embodiment, which results in an 83.33Ω input impedance at Port 2 and Port 3 when the remaining ports are properly terminated. Generally, the resistance of each of the resistor elements is equal to the cables that are connected thereto (i.e., the delivery cable 160 and the open-ended delay cable 165).

The idealized voltage scattering parameters for enabling a 50Ω power splitter 200 to have reflection cancellation such that the return reflection at the two output ports (i.e., Port 2 and Port 3) equals the pulse transfer between them is described as follows and summarized in Table 1:

$S_{11}=0$ (50Ω looking into the input with no return reflection);

$S_{21}=S_{31}=\frac{1}{2}$ (passing half the voltage through without inversion);

$S_{32}=S_{23}=\frac{1}{4}$ (passing one-quarter the voltage through without inversion);

$S_{12}=S_{13}=\frac{1}{2}$ (passing half the voltage through without inversion);

$S_{22}=S_{33}=\frac{1}{4}$ (reflecting one-quarter the voltage without inversion); and Ports 2 and 3 are 83.3Ω (looking into them with the other ports terminated in 50Ω).

Note that $S_{22}=S_{33}=S_{32}=S_{23}$, so the pulses going into either output are reflected back/transmitted through equally to both outputs (with attenuation of 6 dB). In this manner, two pulses going into the outputs at the same time are added together, attenuated, and then equally sent back out to both outputs.

TABLE 1

| Scattering Parameters | Power (dB) | Voltage Ratio |
|---|---|---|
| $S_{11}$ Input return | $-\infty$ | 0 |
| $S_{21}$ and $S_{31}$ Forward voltage transfer | $-6$ | 0.5 |
| $S_{12}$ and $S_{13}$ Reverse voltage transfer | $-6$ | 0.5 |
| $S_{22}$ and $S_{33}$ Return at the outputs | $-12$ | 0.25 |
| $S_{23}$ and $S_{32}$ Transfer between output ports | $-12$ | 0.25 |

With the delivery cable 160 and DUT 105 on Port 2 and the open-ended delay line 165 on Port 3, an incident voltage step of magnitude +1 into Port 1, the power splitter 200 produces the incident pulses:

+1*$S_{21}$=+½ to the DUT and +1*$S_{31}$=+½ to the delay line.

When the reflections are sent back to the power splitter 200, the open-ended delay line 165 reflects in phase without loss so it has an amplitude of +½ and the DUT reflection is bounded by +½ (open circuit) and −½ (short circuit). The voltage re-reflecting from the power splitter going back to the DUT 105 is:

x*$S_{22}$+½*$S_{23}$, where −½<x<½, so this equals x*¼+ ½*¼=x/4+⅛, which over the range of x we have 0<x/4+⅛<¼.

Therefore, the first re-reflection is never inverted relative to the incident pulse, and the combination of the power splitter 200 and the open-ended delay line 165 can act like a TLP system with an attenuator of 6 dB (open circuit case) going up to infinite attenuation (short circuit case).

The reflection going back to the pulse generator from the power splitter 200 is:

x*$S_{12}$+½*$S_{13}$, where −½<x<½, so this equals x*½+ ½=x/2+¼, which over the range of x we have 0<x/2+ ¼<½.

Thus, the second re-reflection is from the charge line 125 going back to the DUT 105 through the power splitter 200 with $S_{21}$ which results in 0 to +¼ of the initial pulser voltage.

Figure 3:
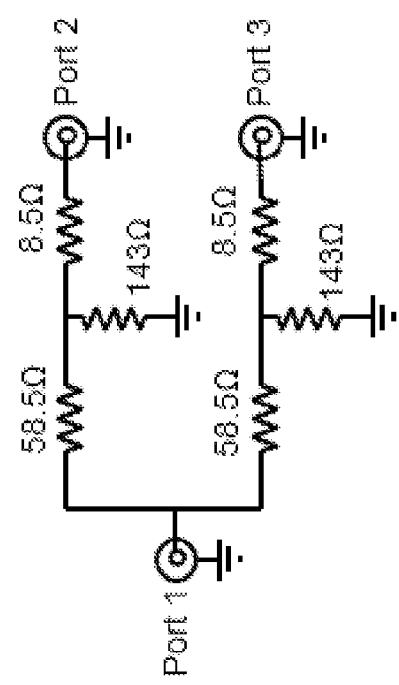
FIG. 3 shows a circuit schematic of a power splitter that can be implemented in the pulse delivery circuit depicted in FIG. 1 according to an alternative embodiment of the present invention.

FIG. 3 shows a circuit schematic of a power splitter 300 according to an alternative embodiment of the present invention that can be implemented in the pulse delivery circuit 100 depicted in FIG. 1. Like power splitter 200, $S_{22}$=$S_{33}$=$S_{23}$=$S_{32}$ in the power splitter 300. However, instead of having only one resistor element coupled to the output ports, the first output (Port 2) and the second output (Port 3) of the power splitter 300 each comprises a resistor network of resistor elements that connects to the input (Port 1). In this embodiment, the power splitter 300 reduces the re-reflections from an open circuit by a predetermined factor (e.g. one-eighth (18 dB)). The idealized scattering parameters for power splitter 300 are summarized below in Table 2.

TABLE 2

| Scattering Parameters | Power (dB) | Voltage Ratio |
|---|---|---|
| $S_{11}$ Input return | $-\infty$ | 0 |
| $S_{21}$ and $S_{31}$ Forward voltage transfer | $-9$ | 0.354 |
| $S_{12}$ and $S_{13}$ Reverse voltage transfer | $-9$ | 0.354 |

TABLE 2-continued

| Scattering Parameters | Power (dB) | Voltage Ratio |
|---|---|---|
| $S_{22}$ and $S_{33}$ Return at the outputs | $-18$ | 0.125 |
| $S_{23}$ and $S_{32}$ Transfer between output ports | $-18$ | 0.125 |

Figure 4C:
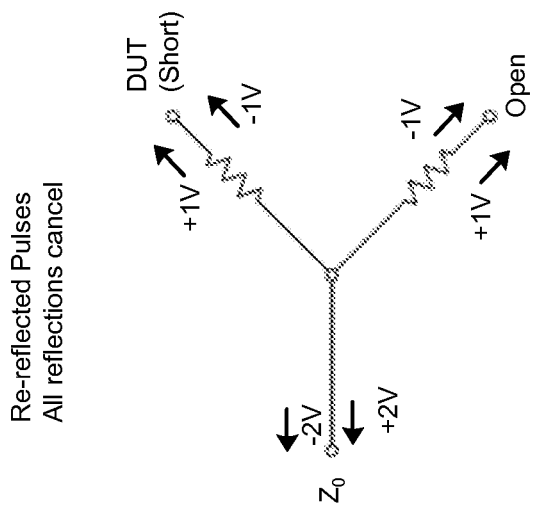
FIGS. 4A-4C illustrate an example of the reflection cancellation performed by the pulse delivery circuit depicted in FIG. 1.
Figure 4B:
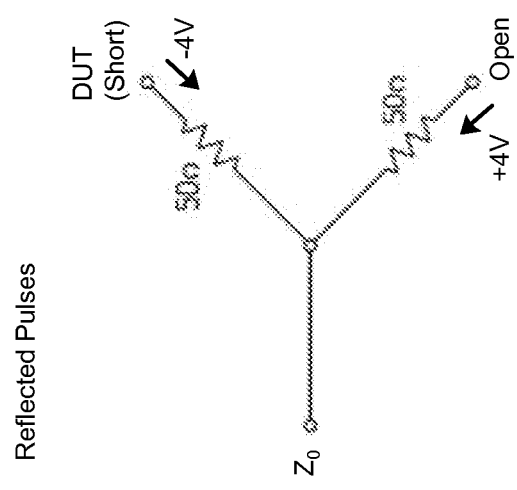
Figure 4A:
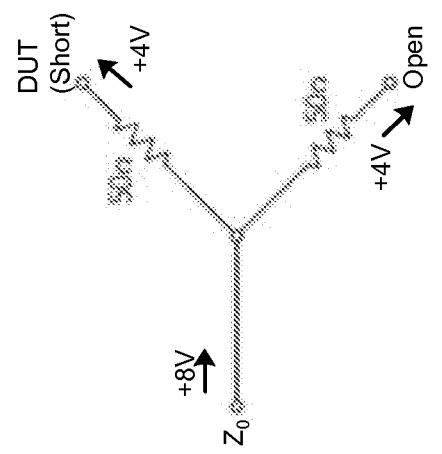

FIGS. 4A-4C illustrate an example of the reflection cancellation that can be performed by the power splitter 140 generally depicted in the pulse delivery circuit 100 of FIG. 1, or the power splitter illustrated in FIG. 2. For clarity, the power splitter illustrated in FIGS. 4A-4C does not specifically depict the input (Port 1) and the two outputs (Port 2 and Port 3), however, the connection to $Z_0$, which corresponds to a connection to the pulse generator 110 (FIG. 1), is representative of the input of the power splitter having an input impedance of $Z_0$, while DUT (Short) is representative of the output connection with the DUT 105 (FIG. 1) in a shorted condition, and Open is representative of the output connection with the open-ended delay cable 165 (FIG. 1). The combining and splitting functions performed by the power splitter are represented by the center junction juxtaposed between $Z_0$, DUT and Open.

In the example illustrated in FIGS. 4A-4C, the power splitter receives an incoming incident pulse of +8V from the pulse generator (FIG. 4A). As shown in FIG. 4A, the power splitter splits the +8V pulse to +4V for each output. In this manner, the power splitter directs +4V to the DUT via a 50Ω resistor and +4V to the open-ended delay cable via a 50Ω resistor. That is, the power splitter sends one quarter power to each output, while dissipating half the incident power inside itself.

FIG. 4B shows the reflection that occurs at the DUT and the open-ended delay cable. Generally, half of the incident voltage will hit the DUT and cause a voltage reflection that can range from full magnitude non-inverted (i.e., when there is an open circuit at the DUT) to full magnitude inverted (i.e., when there is a short circuit at the DUT) of its half incident voltage. Half of the incident power is dissipated by the two 50Ω resistors inside the power splitter. The reflection from the open-ended delay cable is always non-inverted and of the same magnitude as the pulse to the DUT. The power splitter receives these reflections from the DUT and the open-ended delay cable and combines them in equal parts.

As shown in FIG. 4B, the DUT generates a −4V reflection that is directed back to the power splitter, while the open-ended delay cable generates a +4V reflection back to the power splitter. As mentioned above, the −4V reflection arises due to the nature of the DUT having an impedance that is less than the pulse generator. Generally, the DUT reflection is dependent on the DUT impedance, and can be inverted or non-inverted from zero to full pulse magnitude. The +4V reflection arises due to the open-circuit termination of the open-ended delay cable having an impedance greater than the pulse generator.

FIG. 4C shows the result after the power splitter has combined the reflections from the DUT and the open-ended delay cable in equal parts. That is, the power splitter due to its structured configuration described above, re-reflects one-quarter of the reflection from the DUT plus one-quarter of the reflection from the open-ended delay cable to the DUT. This combined re-reflection, which is never inverted, will be at least 6 dB down from the DUT's initial pulse. The power splitter also re-reflects another one-quarter of the reflection from the DUT plus one-quarter of the reflection from the open-ended delay cable to the open-ended delay cable. The power splitter generates an additional re-reflection from the remaining one-half of the reflection from the DUT and the open-ended delay cable that is directed to the pulse generator. This combined re-reflection back to the pulse generator is always non-inverted and will be reduced by at least 6 dB from the incident pulse. In this manner, with a short circuit DUT, the re-reflections sum to zero enabling the power splitter to cancel out all reflections. With DUT impedances greater than zero, additional re-reflections that arise between the DUT and the power splitter are met with the same full non-inverted pulse from the open-ended delay cable that add to the DUT re-reflections, which cancel them leaving small non-inverted re-reflections. This can continue until all of these re-reflections are eventually canceled out by the power splitter's effective attenuation. All additional re-reflections are always non-inverted.

As shown in FIG. 4C, the −4V reflection from the DUT and the +4V reflection from the open-ended delay cable are combined by the power splitter in equal parts and reflected back to the DUT, the open-ended delay cable and the pulse generator. In particular, the power splitter re-reflects −1V (one-quarter of the reflection from the DUT) plus +1V (one-quarter of the reflection from the open-ended delay cable) to the DUT, which combine to zero. The power splitter also re-reflects −1V (another one-quarter of the reflection from the DUT) plus +1V (another one-quarter of the reflection from the open-ended delay cable) to the open-ended delay cable. The power splitter re-reflects the remaining +2V plus −2V (remaining one-half of the reflection from the DUT and the open-ended delay cable) to the pulse generator. In this manner, FIG. 4C shows that all of the re-reflections sum to zero enabling the power splitter to completely cancel all the reflections. This removes the impact that inverted voltage reflections can have on the DUT.

Figure 5:
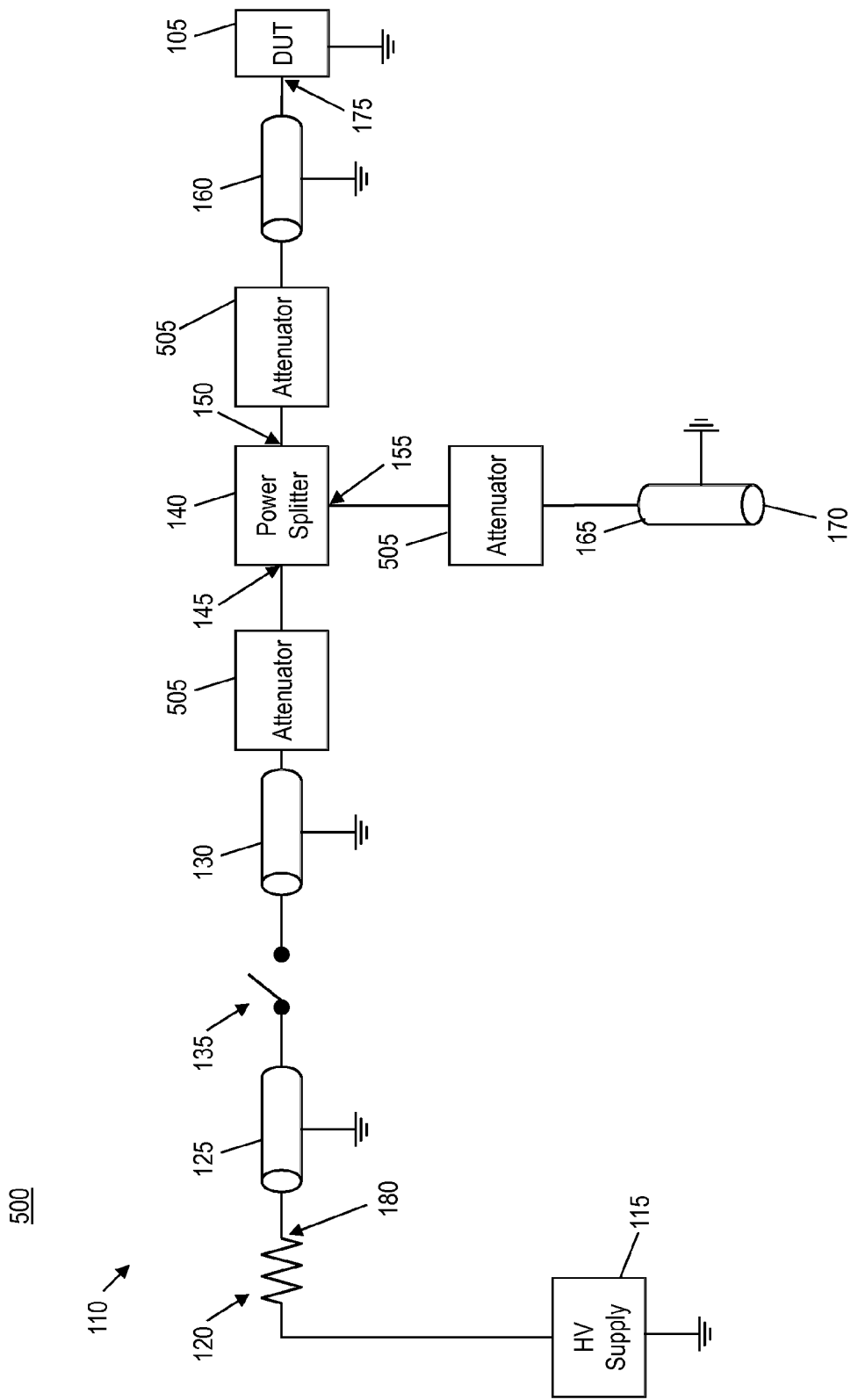
FIG. 5 shows a pulse delivery circuit according to an alternative embodiment of the present invention.

FIG. 5 shows a pulse delivery circuit 500 according to an alternative embodiment of the present invention. The pulse delivery circuit 500 is similar to the pulse delivery circuit 100 of FIG. 1, except that this configuration illustrates the use of attenuators 505 coupled to the power splitter 140. In one embodiment, an attenuator 505 can be connected between the input 145 of the power splitter 140 and the delay line 130. Another attenuator 505 can be connected between the output 150 of the power splitter 140 and the delivery cable 160. A third attenuator 505 can be connected between the output 155 of the power splitter 140 and the open-ended delay cable 165.

The attenuators 505 illustrated in FIG. 5 can be used in addition to the aforementioned structure of the power splitter 140 to further reduce the re-reflections when the DUT impedance is greater than zero. In particular, the attenuator 505 that is connected between the input 145 of the power splitter 140 and the delay line 130 can reduce the reflections from the pulse generator, while the attenuators 505 connected to the outputs 150 and 155 of the power splitter 140 can reduce the re-reflections between the DUT 105 and the power splitter 140, as well as re-reflections from the pulse generator 110. In one embodiment, the attenuator 505 that is connected between the input 145 of the power splitter 140 and the delay line 130 can be, for example, a 6 dB attenuator which can reduce re-reflections by as much as 75%. In one embodiment, the attenuators 505 connected to the outputs 150 and 155 of the power splitter 140 can be, for example, 3 dB attenuators that provide substantial equal attenuation of the re-reflections between the DUT 105 and the power splitter 140, and any re-reflections from the pulse generator 110. As used herein, substantial equal attenuation means attenuation power values that differ by 1 dB or less.

Although FIG. 5 shows three attenuators 505 in use with the pulse delivery circuit 500, it is not meant to limit the scope of the various embodiments of the present invention. Instead, there may be only one attenuator 505 or two attenuators 505 located about the power splitter 140. For example, there may be a first attenuator 505 connected to the output 150 of the power splitter 140 and a second attenuator 505 connected to the output 155 of the power splitter 140, while the input 145 of the power splitter 140 connects directly to the delay line 130.

Figure 6:
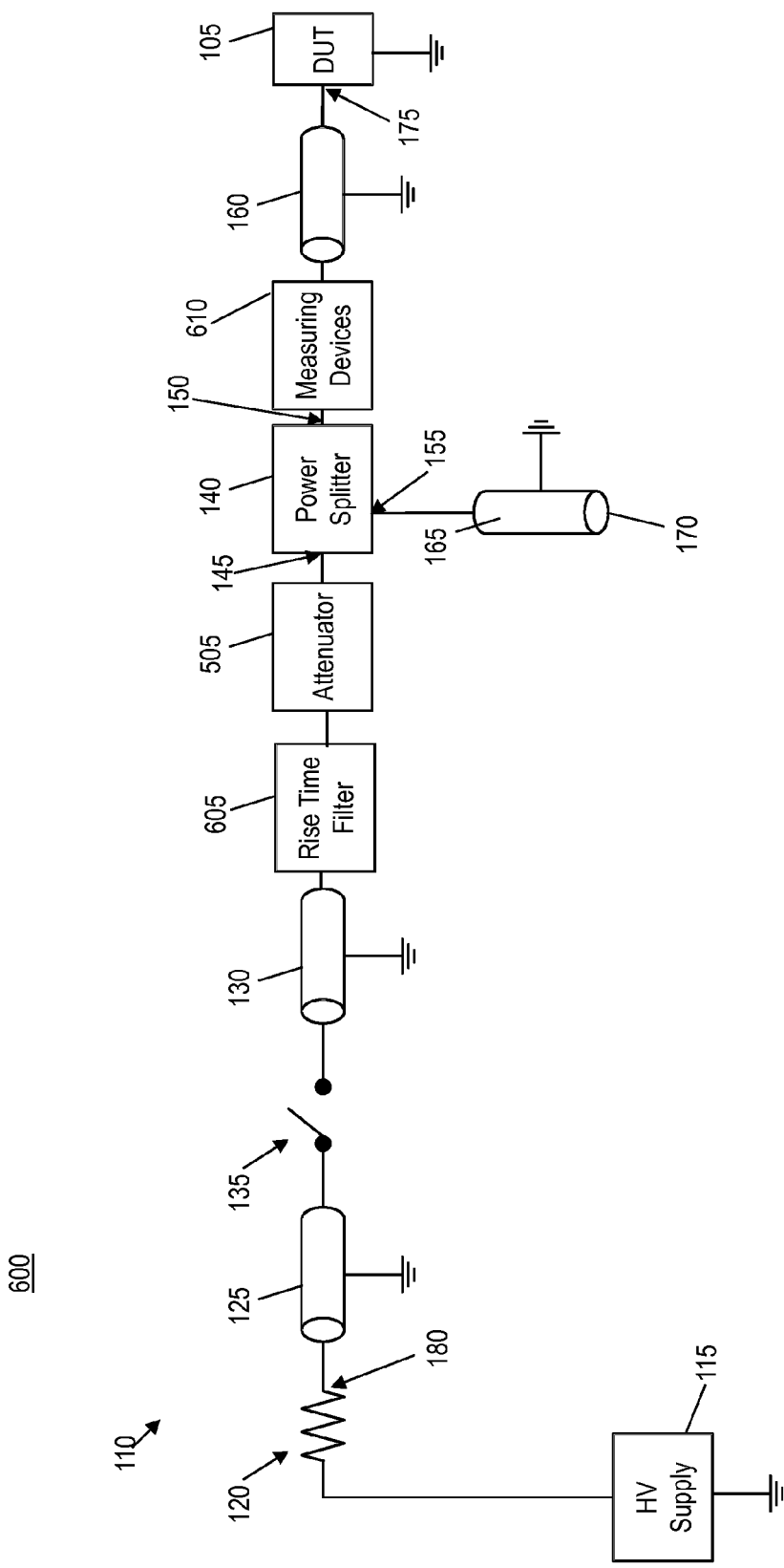
FIG. 6 shows a pulse delivery circuit according to another alternative embodiment of the present invention.

FIG. 6 shows a pulse delivery circuit 600 according to an alternative embodiment of the present invention. In this embodiment, a signal conditioning element such as, for example, a rise time filter 605 can be used in conjunction with an attenuator 505 on the input 145 of the power splitter 140. Although FIG. 6 shows the rise time filter 605 in use with the attenuator 505, it is not meant to limit the scope of the various embodiments of the present invention, as the rise time filter 605 can connect directly to the input 145 of the power splitter 140 without the attenuator 505 placed therebetween. The rise time filter 605 in this embodiment can be used if a longer rise-time is desired in certain test applications. In particular, the rise time filter 605 can be, for example, a 250 ps rise time filter, while the attenuator 505 can be, for example, a 3 dB attenuator.

FIG. 6 also shows a measuring devices 610 can be connected to the output 150 of the power splitter 140 to obtain electrical parameter measurements from the currents carried by the delivery cable 160. The measuring devices 610 can include, but are not limited to, a sampling device, a voltage sensor, a current sensor, an oscilloscope, a frequency analyzer, a semiconductor parameter analyzer, etc. Measuring polarities and magnitudes of the incident and reflected pulse voltages and currents directed to the DUT 105 enables calculation of the voltage across the DUT and currents passing therethrough. The voltage across the DUT 105 and currents passing through it can be used to generate current vs. voltage curves that can characterize the level at which the DUT 105 fails.

Figure 7:
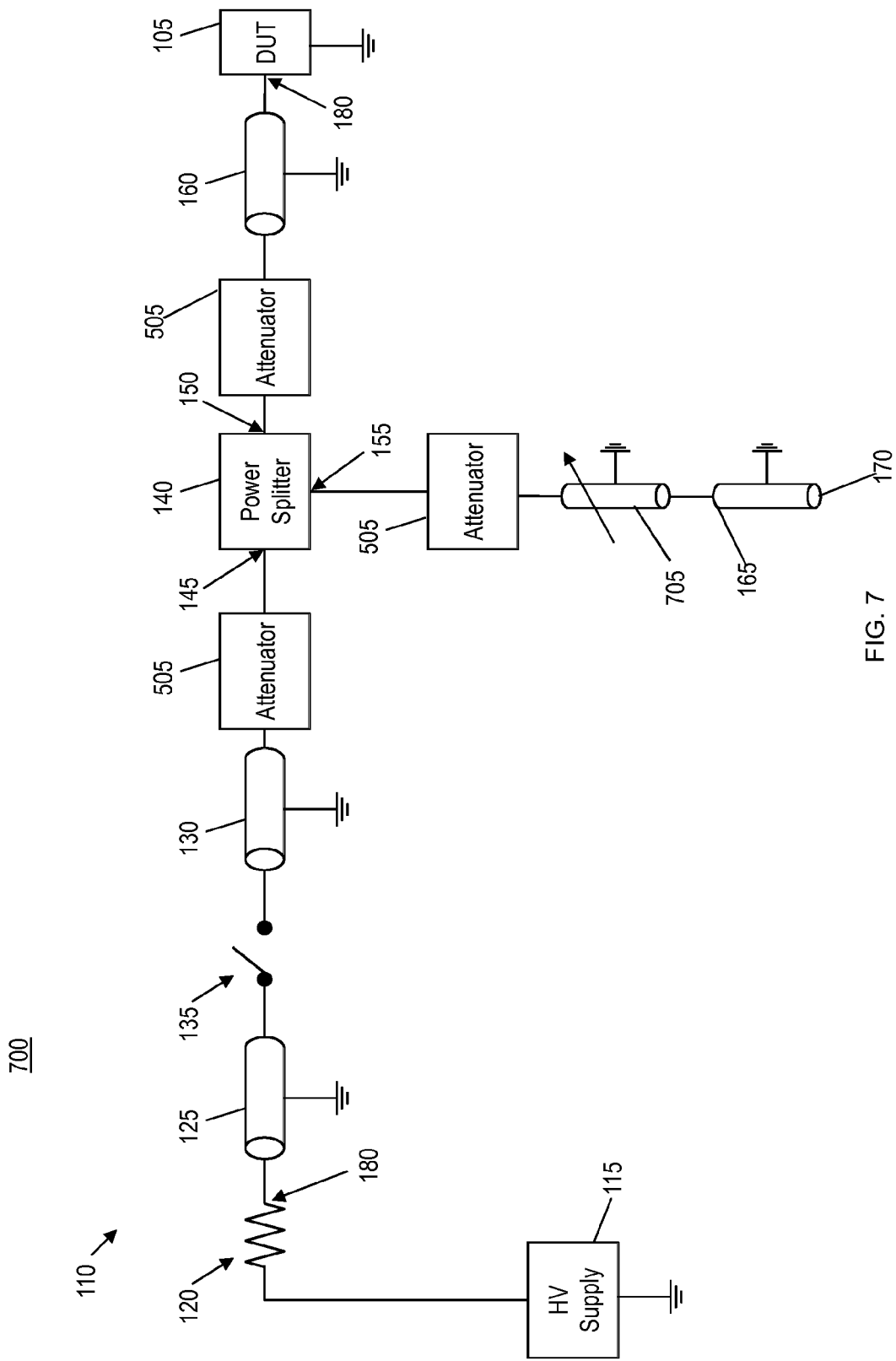
FIG. 7 shows a pulse delivery circuit according to still another alternative embodiment of the present invention.

FIG. 7 shows a pulse delivery circuit 700 according to an alternative embodiment of the present invention. In this embodiment, a cable length trim adjuster 705 can be added to trim the length of the open-ended delay cable 165. Although a cable length trim adjuster 705 for the delivery cable 160 is not illustrated in FIG. 7, those skilled in the art will appreciate that one could be used in conjunction with or without the cable length trim adjuster for the open-ended delay cable 165. Furthermore, a cable length trim adjuster 705 can be used with the charge line 125 and the delay line 130. In effect, the cable length trim adjuster 705 allows for precise matching of the propagation delays between the two outputs (i.e., 150 and 155) from the power splitter 140. A microwave phase adjuster is an illustrative, but non-exhaustive example of a device that can be used as the cable length trim adjuster 705.

As mentioned above, the delivery cable 160 and the open-ended delay cable 165 can have lengths that are substantially similar, and the cable length trim adjuster 705 can be used to adjust the lengths of these cables in order to attain a certain loss and attenuation for each cable. For example, the cable length trim adjuster 705 can be used to trim the open-ended delay cable 165 to be as short as half the pulse length. Short cables can have less loss and better high frequency performance for VF-TLP.

The various embodiments of the present invention as described herein can provide reflection control in TLP and VF-TLP systems that cancels out pulse reflections from a DUT that has received an incident pulse from a pulse generator. This ensures that any measured DUT failure current level is from the incident pulse and not from any unintended reflections from the DUT and the pulse generator. In the various embodiments of the present invention, a power splitter is structured to substantially cancel out these re-reflections from the DUT and the pulse generator. Any small re-reflections that remain are quite small and are eventually attenuated by the power splitter. In addition, these re-reflections are non-inverted (i.e., the same polarity as the incident pulse) regardless of the DUT impedance. This ensures that an inverted (i.e., a polarity that is different from the incident pulse) pulse voltage is not directed to the DUT, thereby removing unnecessary stress on the DUT and removing false failures of any ESD protection device included in the DUT. In addition, the use of passive elements such as, for example, a power splitter, cables, and attenuators enable the various embodiments of the present invention to avoid undesired properties that are associated with using active or non-linear elements such as diodes and transistors for reflection control. These undesired properties can include, but are not limited to: large parasitic loads that increase the rise time of the incident pulse; diode turn on time that may not be suitable for a 1 ns VFTLP; and the need to change the diode direction when changing the incident pulse polarity.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A pulse delivery circuit, comprising:
  a device under test (DUT);
  a pulse generator configured to generate an incident pulse for application to the DUT;
  a power splitter having an input and a first output and a second output, wherein the power splitter splits the incident pulse into two substantially identical pulses each having a polarity that is the same as the incident pulse;
  a delivery cable having an approximately constant impedance along its length is connected to the first output of the power splitter, wherein the delivery cable receives a first split pulse from the first output and transmits the first split pulse to the DUT; and
  an open-ended delay cable having an approximately constant impedance along its length and similar end-to-end pulse propagation delay time as the delivery cable, wherein the open-ended delay cable is connected to the second output of the power splitter to receive a second split pulse from the second output;
  wherein the power splitter receives a first pulse reflection from the DUT via the delivery cable at the first output, the first pulse reflection having a polarity that is inverted or non-inverted in comparison to the first split pulse, and a magnitude that ranges from zero to full magnitude of the first split pulse,
  wherein the power splitter receives a second pulse reflection from the open-ended delay cable at the second output, with a polarity that is the same as the polarity of the second split pulse and a magnitude that is similar to a magnitude of the second split pulse, the first pulse reflection and the second pulse reflection are received at the power splitter at approximately the same time due to the delivery cable and the open-ended delay cable having similar end-to-end pulse propagation delay times,
  wherein the power splitter combines the first pulse reflection and the second pulse reflection in equal parts,
  wherein the power splitter attenuates and re-reflects the combined equal parts of the first pulse reflection and the second pulse reflection as re-reflected pulses that have a polarity that is the same as the polarity of the incident pulse, and
  wherein the power splitter directs a first portion of re-reflected pulses to the pulse generator from the input, a second portion of re-reflected pulses to the DUT from the first output via the delivery cable, and a third portion of re-reflected pulses to the open-ended delay cable from the second output, wherein all of the re-reflected pulses to the DUT and the open-ended delay cable are attenuated approximately equally.

2. The pulse delivery circuit according to claim 1, further comprising an attenuator located between the pulse generator and the input of the power splitter.

3. The pulse delivery circuit according to claim 1, further comprising a first attenuator located between the first output of the power splitter and the delivery cable, and a second attenuator located between the second output of the power splitter and the open-ended delay cable, wherein the first attenuator and the second attenuator have substantially equal attenuation.

4. The pulse delivery circuit according to claim 1, further comprising a rise time filter located between the pulse generator and the input of the power splitter.

5. The pulse delivery circuit according to claim 1, further comprising a measuring device configured to obtain electrical parameter measurements from the currents carried by the delivery cable.

6. The pulse delivery circuit according to claim 1, wherein the pulse generator includes one of a transmission line pulse generator, a very fast transmission line pulse generator, and a solid-state pulse generator.

7. The pulse delivery circuit according to claim 1, wherein the first output and the second output of the power splitter each comprises a resistor element that connects to the input of the power splitter, wherein each resistor element has a resistance that is equal to an impedance of one of the delivery cable and the open-ended delay cable.

8. The pulse delivery circuit according to claim 1, wherein the first output and the second output of the power splitter each comprises a resistor network of resistor elements that connects to the input of the power splitter, wherein the resistor elements of each resistor network is configured to reduce reflections from the DUT and the open-ended delay cable by a predetermined factor.

9. The pulse delivery circuit according to claim 1, wherein the length of the delivery cable is substantially similar to the length of the open-ended delay cable.

10. The pulse delivery circuit according to claim 1, wherein all combined re-reflected pulses from the power splitter are non-inverted and vary in amplitude from a maximum of 50% of the first split pulse to no net reflection.

11. The pulse delivery circuit according to claim 1, wherein the polarity of the first pulse reflection is dependent on an impedance of the DUT, and the magnitude of the first pulse reflection is the full magnitude of the first split pulse in response to the DUT being shorted or open.

12. The pulse delivery circuit according to claim 1, wherein the first pulse reflection and all re-reflected pulse reflections in the delivery cable, and the second pulse reflection and all re-reflected pulse reflections in the open-ended delay cable sum to a value ranging between zero and a magnitude of the first split pulse.

13. The pulse delivery circuit according to claim 1, further comprising at least one cable length trim adjuster configured to trim the length of one of the delivery cable and the open-ended delay cable.

14. A method, comprising:
generating an incident pulse with a pulse generator;
applying the incident pulse to a power splitter having an input and a first output and a second output each having a resistor element that connects to the input;
splitting the incident pulse into two substantially identical pulses each having a polarity that is the same as the incident pulse with the power splitter;
directing a first split pulse from the first output of the power splitter to a delivery cable having an approximately constant impedance along its length that transmits the first split pulse to a device under test (DUT);
directing a second split pulse from the second output of the power splitter to an open-ended delay cable having an approximately constant impedance along its length that provides an end-to-end pulse propagation delay time that is substantially identical to that of the delivery cable;
receiving a first pulse reflection from the DUT via the delivery cable at the first output of the power splitter, the first pulse reflection having a polarity that is inverted or non-inverted in comparison to the first split pulse, and a magnitude that ranges from zero to full magnitude of the first split pulse;
receiving a second pulse reflection from the open-ended delay cable at the second output of the power splitter, the second pulse reflection having a polarity that is the same as the second split pulse and a magnitude that is similar to a magnitude of the second split pulse, wherein the first pulse reflection and the second pulse reflection are received at the power splitter at approximately the same time due to the delivery cable and the open-ended delay cable having similar end-to-end pulse propagation delay times;
combining the first pulse reflection and the second pulse reflection in equal parts at the power splitter; and
attenuating and re-reflecting the combined equal parts of the first pulse reflection and the second pulse reflection as re-reflected pulses from the power splitter that have a polarity that is the same as the polarity of the incident pulse, wherein the power splitter directs a first portion of re-reflected pulses to the pulse generator from the input, a second portion of re-reflected pulses to the DUT from the first output via the delivery cable, and a third portion of re-reflected pulses to the open-ended delay cable from the second output, wherein all of the re-reflected pulses to the DUT and the open-ended delay cable are attenuated approximately equally.

15. The method according to claim 14, further comprising placing a first attenuator between the first output of the power splitter and the delivery cable, and a second attenuator between the second output of the power splitter and the open-ended delay cable, wherein the first attenuator and the second attenuator have substantially equal attenuation.

16. The method according to claim 14, further comprising placing a rise time filter before the input of the power splitter.

17. The method according to claim 14, further comprising placing a measuring device placed along the length of the delivery cable.

18. The method according to claim 14, wherein the pulse generator includes one of a transmission line pulse generator, a very fast transmission line pulse generator, and a solid-state pulse generator.

19. The method according to claim 14, wherein the polarity of the first pulse reflection is dependent on an impedance of the DUT and the magnitude of the first pulse reflection is the full magnitude of the first split pulse in response to the DUT being shorted or open.

20. The method according to claim 14, wherein the first pulse reflection and all re-reflected pulse reflections in the delivery cable and the second pulse reflection and all re-reflected pulse reflections in the open-ended delay cable sum to a value ranging between zero and a magnitude of the first split pulse.

* * * * *